United States Patent [19]

Collings

[11] Patent Number: 5,083,605
[45] Date of Patent: Jan. 28, 1992

[54] SELF-PUMPING PHASE CHANGE THERMAL ENERGY DEVICE

[75] Inventor: Roger J. Collings, Rockford, Ill.

[73] Assignee: Sundstrand Corporaiton, Rockford, Ill.

[21] Appl. No.: 569,878

[22] Filed: Aug. 17, 1990

[51] Int. Cl.$^5$ ............... F28D 20/00; H01L 23/473
[52] U.S. Cl. ............................ 165/10; 165/32; 165/40; 165/41; 165/104.33
[58] Field of Search ............. 165/32, 41, 104.19, 165/40, 10, 104.33

[56] References Cited

U.S. PATENT DOCUMENTS

| | | | |
|---|---|---|---|
| 3,391,728 | 7/1968 | Kelly | 165/32 |
| 4,341,202 | 7/1982 | French | 165/104.22 |
| 4,377,198 | 3/1983 | Welling et al. | 165/41 |
| 4,467,862 | 8/1984 | De Beni | 165/104.22 |

Primary Examiner—Albert W. Davis, Jr.

[57] ABSTRACT

This invention relates to a thermal energy device for receiving and storing externally applied thermal energy. The thermal energy device includes a thermal energy receiver which is adapted to receive the intermittent externally applied thermal energy to heat and expand a fluid in the thermal energy receiver. A thermal energy store is in fluid communication with the thermal energy receiver to receive and store the heated and expanded fluid received from the thermal energy receiver. The thermal energy store is responsive to the receiving and storing of the heated and expanded fluid such that, as the heated and expanded fluid is received and stored, the thermal energy store delivers more of the fluid to the thermal energy receiver to continue accommodating the intermittent externally applied thermal energy. The thermal energy store is also responsive to dissipation of the intermittent externally applied thermal energy into the fluid such that, as the intermittent externally applied thermal energy is dissipated and the heated and expanded fluid contracts, the thermal energy store returns the fluid to the thermal energy receiver in preparation for subsequent intermittent externally applied thermal energy.

19 Claims, 1 Drawing Sheet

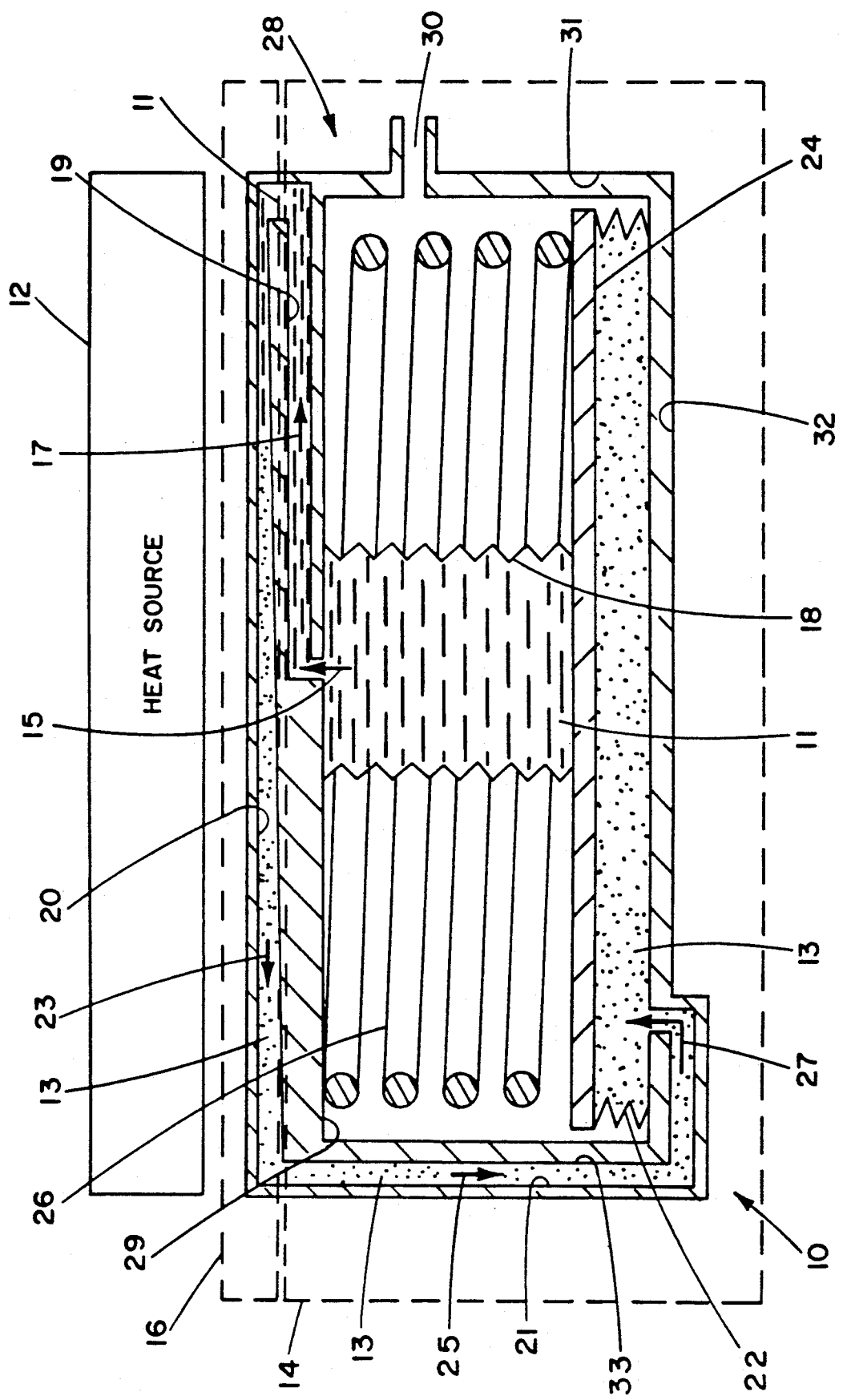

SELF-PUMPING PHASE CHANGE THERMAL ENERGY DEVICE

TECHNICAL FIELD

This invention relates to a self-pumping phase change thermal energy device which is designed to handle short-term thermal overload conditions.

BACKGROUND ART

Aircraft systems in general, and variable speed constant frequency electrical generating systems in particular, must be designed to survive short-term thermal overload conditions. This may be achieved by designing a cooling system that is sized for a worst case thermal overload condition but is significantly oversized for normal operating conditions. As thermal overload durations are short, lasting only a few seconds, a more efficient cooling system should involve sizing the system for a maximum long-term dissipation and should incorporate a thermal energy device to handle a short-term thermal overload condition.

Problems associated with a weight of a thermal energy device require the use of a phase change material. However, solid to liquid phase change materials which have a suitably high latent heat of fusion and melt at temperatures approximate to a maximum allowable temperature for a heat source have low thermal conductivities. Consequently, excessive temperatures develop at the heat source as large temperature differentials are required to drive the heat into the thermal energy device. The buildup of stress levels with each phase change resulting from melting and solidifying fronts moving in different directions further contributes to the imperfections present with solid to liquid phase change materials.

The desirability of removing heat from electronic equipment when temperatures outside of a missile envelope are lower than those of the electronic equipment is recognized in a patent to Basilius, U.S. Pat. No. 4,673,030, in which a unidirectional heat pipe and a phase change material package are employed. When the temperature exterior to the missile envelope is greater than that of the electronic equipment, the heat therefrom is conducted to a package containing phase change material which absorbs the heat from the electronic equipment, at which time the heat pipe acts as a thermal insulator. The patent to Basilius does not, as the invention to be described more fully hereinafter, address the operation of a thermal energy device except to mention various candidate solid to liquid phase change materials.

The problem of removing heat from electronic equipment is also discussed in a patent to Feldmanis, U.S. Pat. No. 3,651,865. The Feldmanis patent teaches an electronic equipment mounting plate with capillary heat pipes secured thereto. A condenser section is provided near the center of the mounting plate for a coolant to pass through cooling tubes positioned adjacent a central portion of the heat pipes to provide a heat sink. The patent to Feldmanis does not, as the invention to be described more fully hereinafter, provide for pumping a fluid to a location of heat input or account for a volumetric increase due to vaporization of a fluid.

A thermal analog of an electronic capacitor, i.e., a thermal capacitor, has a pair of similar chambers in vapor communication disclosed in a patent to Moore, Jr., U.S. Pat. No. 3,738,421. A liquid comprising a vaporizable heat transfer material and a substantially non-vaporizable solute with a relatively broad solubility range is contained in each chamber. Vaporization of the heat transfer material from one chamber and condensation in the other serves to "charge" or "discharge" the thermal capacitor. The invention to be described hereinafter avoids using a mixture of two different fluids by employing a single fluid within a single thermal energy device.

DISCLOSURE OF INVENTION

More specifically, this invention relates to a thermal energy device for receiving and storing externally applied thermal energy. The thermal energy device includes a thermal energy receiver which is adapted to receive the inermittent externally applied thermal energy to heat and expand a fluid in the thermal energy receiver. A thermal energy store is in fluid communication with the thermal energy receiver to receive and store the heated and expanded fluid received from the thermal energy receiver. The thermal energy store is responsive to the receiving and storing of the heated and expanded fluid such that, as the heated and expanded fluid is received and stored, the thermal energy store delivers more of the fluid to the thermal energy receiver to continue accommodating the intermittent externally applied thermal energy. The thermal energy store is also responsive to dissipation of the intermittent externally applied thermal energy into the fluid such that, as the intermittent externally applied thermal energy is dissipated and the heated and expanded fluid contracts, the thermal energy store returns the fluid to the thermal energy receiver in preparation for subsequent intermittent externally applied thermal energy.

It is therefore a primary object of the invention to provide a self-pumping phase change thermal energy device which is designed to handle short-term overload conditions found in variable speed constant frequency electric generating systems.

Another object of the invention is to provide a small bellows and a large bellows in conjunction with each other to compress the small bellows upon expansion of the large bellows to thereby force a fluid in the small bellows towards a thermal energy receiver. During dissipation of the intermittent externally applied thermal energy into the fluid causing the fluid to contract, the large bellows compresses upon expansion of the small bellows to thereby draw the fluid back from the thermal energy receiver into the small bellows.

Yet another object of this invention is to provide an enclosure which surrounds the thermal energy in the thermal energy device store. The enclosure includes an orifice to accommodate a sudden decompression of a pressurized region outside the thermal energy device whereby the orifice vents the enclosure of the thermal energy store to the outside region such that the fluid in the thermal energy receiver can accommodate the externally applied thermal energy without interruption during the sudden decompression.

In the attainment of the foregoing objects, the invention contemplates in its preferred embodiment a thermal energy device for receiving and storing intermittent externally applied intermittent thermal energy.

The thermal energy device includes a small bellows to store a fluid. The thermal energy device also includes at least one enclosed thermal energy receiving channel in fluid communication with the small bellows. The thermal energy receiving channel is adapted to receive the intermittent externally applied thermal energy to heat and expand the fluid in the thermal energy receiving channel.

The thermal energy device further includes a large bellows in fluid communication with the thermal energy receiving channel to receive and store the fluid heated and expanded in the thermal energy receiving channel. The large bellows includes a diaphragm which is coupled to the small bellows compressing the small bellows upon expansion of the large bellows thereby forcing the fluid in the small bellows towards the thermal energy receiving channel. The diaphragm is responsive to dissipation of the intermittent externally applied thermal energy into the fluid such that as the intermittent externally applied thermal energy is dissipated and the heated and expanded fluid contracts, the diaphragm acts upon the large bellows compressing the large bellows upon expansion of the small bellows thereby drawing the fluid back from the thermal energy receiving channel into the small bellows.

The thermal energy device further includes a return spring coupled with the diaphragm. The return spring acts upon the diaphragm to ensure that as the intermittent externally applied thermal energy is dissipated and the heated and expanded fluid contracts, the diaphragm acts upon the large bellows compressing the large bellows upon expansion of the small bellows thereby drawing the fluid back from the thermal energy receiving channel into the small bellows.

The thermal energy device further includes an enclosure which surrounds the small bellows and the large bellows. The enclosure of the small bellows and the large bellows includes an orifice to accommodate a sudden decompression of a pressurized region outside the thermal energy device. The orifice vents the enclosure of the small bellows and the large bellows to the outside pressurized region such that the fluid in the thermal energy receiving channel can accommodate the externally applied thermal energy without interruption during the sudden decompression.

Other objects and advantages of the present invention will be apparent upon reference to the accompanying description when taken in conjunction with the following drawing:

BRIEF DESCRIPTION OF THE DRAWING

The FIGURE is a cross section of a thermal energy device showing the preferred embodiment of the invention.

BEST MODE FOR CARRYING OUT THE INVENTION

Reference is now made to the FIGURE which shows a thermal energy device 10 in its preferred embodiment. The thermal energy device 10 which is generally cylindrical in nature should be made from a highly conductive material such as metal. However, a graphite filled metal matrix composite is within the scope of the invention. Two major groupings of thermal energy device elements are present in dotted outline, namely, a thermal energy receiver 16 which provides a heated and expanded fluid 13 to a thermal energy store 14.

The thermal energy receiver 16 receives intermittent externally applied thermal energy from a heat source 12 located adjacent to the thermal energy receiver 16. The heat source 12 may include an electric generating system in which the thermal energy device 10 is located adjacent to an electronic package which in turn is coupled to a generator, not shown. In the event that the thermal energy device 10 is employed in an aircraft pressurized cabin environment, the electronic package may be cooled via pressurized cabin air. During thermal overload conditions such as either a malfunction of the electronic package or a sudden decompression of a pressurized aircraft cabin, the thermal energy device 10 activates by receiving and storing excess thermal energy via the thermal energy receiver 16 and the thermal energy store 14. A fluid 11 in the thermal energy receiver 16 is heated by the intermittent externally applied thermal energy and expands in volume. The thermal energy store 14 receives and stores the heated and expanded fluid 13 of the thermal energy receiver 16 and delivers an additional supply of the fluid 11 to the thermal energy receiver 16 to continue accommodating the intermittent externally applied thermal energy. After dissipation of the intermittent externally applied thermal energy, the heated and expanded fluid 13 contracts, at which time the thermal energy store 14 returns the fluid 11 to the thermal energy receiver 16 in preparation for subsequent intermittent externally applied thermal energy.

The preferred embodiment of the invention contemplates the use of at least one enclosed thermal energy receiving channel 20 acting as the thermal energy receiver 16 to receive the intermittent externally applied thermal energy emitted from the heat source 12 in the form of surges during the thermal overload conditions. The thermal energy receiving channel 20 may be tapered to promote fluid flow towards the thermal energy store 14. Although not shown in the drawing, several thermal energy receiving channels, such as channel 20, may be connected in parallel for greater capacity to receive the thermal energy surges.

The thermal energy store 14 includes a small bellows 18 which stores the fluid 11 before it is heated and expanded. The small bellows 18 is generally cylindrical in nature and has accordian-like walls constructed from stainless steel or aluminum which compress and expand whereby a volume of the small bellows 18 is controlled. The thermal energy receiving channel 20 is in fluid communication with the small bellows 18 such that the fluid 11 may flow via a delivery channel 19 from the small bellows 18 to the thermal energy receiving channel 20 while the thermal overload conditions exist in the heat source 12.

The thermal energy store 14 further includes a large bellows 22 which receives and stores the fluid 13 which has been heated and expanded in the thermal energy receiving channel 20. Similar to the small bellows 18, the large bellows 22 is generally cylindrical in nature and has accordian-like walls constructed from stainless steel or aluminum which compress and expand to control a volume of the large bellows 22. The large bellows 22 is in fluid communication with the thermal energy receiving channel 20 such that the heated and expanded fluid 13 may flow via an exit channel 21 to either the large bellows 22 or the thermal energy receiving channel 20, depending on whether the thermal energy surges have dissipated from the heat source 12. The large bellows 22 contains a diaphragm 24 which is coupled as shown with the small bellows 18 to provide an intermediary element acting in conjunction with the large bellows 22 and the small bellows 18. The diaphragm 24 extends the complete diameter length of the large bellows 22.

During the thermal overload conditions of the heat source 12, the intermittent externally applied thermal energy is applied to the thermal energy device 10 and the fluid 11 within the thermal energy receiving channel 20 is heated and expanded. The heated and expanded fluid 13 flows via the exit channel 21 from the thermal energy receiving channel 20 into the large bellows 22 as indicated by arrows 23, 25, 27. The large bellows 22 expands as the heated and expanded fluid 13 is received and stored. As the large bellows 22 expands, the diaphragm 24 acts as the intermediary element to compress the small bellows 18. Although a pressure of the large bellows 22 is lower than a pressure of the small bellows 18, the large bellows 22 will expand because a force of the large bellows 22 is greater than a force of the small bellows 18, as the force is equal to the pressure multiplied by an area. The compression of the small bellows 18 forces the additional supply of the fluid 11 stored in the small bellows 18 into the thermal energy receiving channel 20 via the delivery channel 19 as indicated by arrows 15, 17 to continue accommodating the thermal energy surges of the heat source 12.

The diaphragm 24 is responsive to dissipation of the thermal energy surges by the heat source 12 into the thermal energy receiving channel 20. When dissipation of the thermal energy surges occurs and the fluid 13 ceases heating and expanding, the pressure of the large bellows 22 on the diaphragm 24 subsides. As the pressure of the large bellows 22 subsides, the small bellows 18 expands, and the large bellows 22 compresses thereby returning the fluid 11 in the large bellows 22 to the thermal energy receiving channel 20 via the exit channel 21 and drawing some of the fluid 11 back to the small bellows 18 via the delivery channel 19 in preparation for subsequent thermal energy surges.

The thermal energy device 10 also includes a return spring 26 which contains a single helically coiled member surrounding the small bellows 18. The return spring 26 locates between a top wall 29 of an enclosure 28 and the diaphragm 24 upon which the return spring 26 acts. When dissipation of the thermal energy surges occurs and the fluid 13 ceases heating and expanding, the return spring 26 acts upon the diaphragm 24 to ensure that the small bellows 18 expands after which the large bellows 22 compresses thereby returning the fluid 11 in the large bellows 22 to the thermal energy receiving channel 20 via the exit channel 21 and drawing some of the fluid 11 back into the small bellows 18 via the delivery channel 19 in preparation for subsequent thermal energy surges. By selecting a desired compressive strength of the return spring 26, a temperature at which the fluid 11 heats and expands may be controlled to meet the thermal overload conditions present in the heat source 12.

The enclosure 28, defined in the cross-section drawing by side walls 31, 33, a bottom wall 32, and the top wall 29 is constructed from the same material as the thermal energy device 10. The enclosure 28 contains elements of the thermal energy store 14, including the small bellows 18, the large bellows 22, the diaphragm 24, and the return spring 26. An orifice 30 is provided to vent the enclosure 28 to accommodate for a sudden decompression of a pressurized region outside the thermal energy device 10, such as the pressurized aircraft cabin at altitude, in the event that the thermal energy device 10 is employed in the aircraft cabin environment. Consequent to the sudden decompression, cooling of the heat source 12, i.e., the electronic package, will become ineffective. By venting the enclosure 28 to the outside pressurized region via the orifice 30, the sudden decompression of the outside region will result in a reduction of a pressure within the enclosure 28. This reduction in the pressure will reduce the temperature at which the fluid 11 will heat and expand and enable the thermal energy receiver 16 to accommodate the externally applied thermal energy without interruption until the aircraft has dropped to a lower altitude where a capacity for cooling the electronic package may be restored. Alternatively, more than one thermal energy device may be connected via the orifices to a central pressurized cylinder not shown. By changing a pressure in the cylinder, the operating temperature of the connected thermal energy devices may be controlled.

Although this invention has been illustrated and described in connection with the particular embodiments illustrated, it will be apparent to those skilled in the art that various changes may be made therein without departing from the spirit of the invention as set forth in the appended claims.

I claim:

1. A thermal energy device for receiving and storing intermittent externally applied thermal energy, comprising:
   a thermal energy receiving means adapted to receive said intermittent externally applied thermal energy to heat and expand a fluid in said thermal energy receiving means, and
   a thermal energy storage means in fluid communication with said thermal energy receiving means to receive and store said heated and expanded fluid received from said thermal energy receiving means, said thermal energy storage means responsive to receiving and storing of said heated and expanded fluid such that, as said heated and expanded fluid is received and stored, said thermal energy storage means delivers more of said fluid to said thermal energy receiving means to continue accommodating said intermittent externally applied thermal energy, said thermal energy storage means also responsive to dissipation of said intermittent externally applied thermal energy into said fluid such that, as said intermittent externally applied thermal energy is dissipated and said heated and expanded fluid contracts, said thermal energy storage means returns said fluid to said thermal energy receiving means in preparation for subsequent of said intermittent externally applied thermal energy.

2. The thermal energy device of claim 1 wherein said intermittent externally applied thermal energy appears as surges.

3. The thermal energy device of claim 2 wherein said thermal energy storage means includes a small bellows to store said fluid, said small bellows in fluid communication with said thermal energy receiving means delivering said fluid to said thermal energy receiving means.

4. The thermal energy device of claim 3 wherein said thermal energy storage means further includes a large bellows in fluid communication with said thermal energy receiving means to receive and store said heated and expanded fluid received from said thermal energy receiving means.

5. The thermal energy device of claim 4 wherein said large bellows includes a diaphragm, said diaphragm coupled to said small bellows compressing said small bellows upon expansion of said large bellows thereby forcing said fluid in said small bellows towards said thermal energy receiving means, said diaphragm responsive to dissipation of said thermal energy surges into said fluid such that as said thermal energy surges are dissipated and said heated and expanded fluid contracts, said diaphragm acts upon said large bellows compressing said large bellows upon expansion of said small bellows thereby drawing said fluid back from said thermal energy receiving means into said small bellows.

6. The thermal energy device of claim 5 wherein said thermal energy device further includes a return spring coupled with said diaphragm, said return spring acting upon said diaphragm to ensure that as said thermal energy surges are dissipated and said heated and expanded fluid contracts, said diaphragm acts upon said large bellows compressing said large bellows upon expansion of said small bellows thereby drawing said fluid back from said thermal energy receiving means into said small bellows.

7. The thermal energy device of claim 2 wherein said thermal energy receiving means is provided by an enclosed channel through which said fluid passes and is exposed to said thermal energy surges.

8. The thermal energy device of claim 7 wherein said thermal energy storage means includes a small bellows to store said fluid, said small bellows in fluid communication delivering said fluid to said thermal energy receiving channel.

9. The thermal energy device of claim 8 wherein said thermal energy storage means further includes a large bellows in fluid communication with said thermal energy receiving channel to receive and store said heated and expanded fluid received from said thermal energy receiving channel.

10. The thermal energy device of claim 9 wherein said large bellows includes a diaphragm, said diaphragm coupled to said small bellows compressing said small bellows upon expansion of said large bellows thereby forcing said fluid in said small bellows towards said thermal energy receiving channel, said diaphragm responsive to dissipation of said thermal energy surges into said fluid such that as said thermal energy surges are dissipated and said heated and expanded fluid contracts, said diaphragm acts upon said large bellows compressing said large bellows upon expansion of said small bellows thereby drawing said fluid back from said thermal energy receiving channel into said small bellows.

11. The thermal energy device of claim 10 wherein said thermal energy device further includes a return spring coupled with said diaphragm, said return spring acting upon said diaphragm to ensure that as said thermal energy surges are dissipated and said heated and expanded fluid contracts, said diaphragm acts upon said large bellows compressing said large bellows upon expansion of said small bellows thereby drawing said fluid back from said thermal energy receiving channel into said small bellows.

12. The thermal energy device of claim 1 wherein said thermal energy device includes an enclosure surrounding said thermal energy storage means, said enclosure of said thermal energy storage means including an orifice to accommodate a sudden decompression of a pressurized region outside said thermal energy device, said orifice venting said enclosure of said thermal energy storage means to said outside pressurized region such that said fluid in said thermal energy receiving means can accommodate said externally applied thermal energy without interruption during said sudden decompression.

13. The thermal energy device of claim 12 wherein said thermal energy storage means includes a small bellows to store said fluid, said small bellows in fluid communication with said thermal energy receiving means delivering said fluid to said thermal energy receiving means.

14. The thermal energy device of claim 13 wherein said thermal energy storage means further includes a large bellows in fluid communication with said thermal energy receiving means to receive and store said heated and expanded fluid received from said thermal energy receiving means.

15. The thermal energy device of claim 14 wherein said large bellows includes a diaphragm, said diaphragm coupled to said small bellows compressing said small bellows upon expansion of said large bellows thereby forcing said fluid in said small bellows towards said thermal energy receiving means, said diaphragm responsive to dissipation of said intermittent externally applied thermal energy into said fluid such that as said intermittent externally applied thermal energy is dissipated and said heated and expanded fluid contracts, said diaphragm acts upon said large bellows compressing said large bellows upon expansion of said small bellows thereby drawing said fluid back from said thermal energy receiving means into said small bellows.

16. The thermal energy device of claim 15 wherein said thermal energy device further includes a return spring coupled with said diaphragm, said return spring acting upon said diaphragm to ensure that as said intermittent externally applied thermal energy is dissipated and said heated and expanded fluid contracts, said diaphragm acts upon said large bellows compressing said large bellows upon expansion of said small bellows thereby drawing said fluid back from said thermal energy receiving means into said small bellows.

17. The thermal energy device of claim 2 wherein said thermal energy device receives said thermal energy surges from an electric generating system.

18. A thermal energy device for receiving and storing intermittent externally applied thermal energy, comprising:
   a small bellows to store a fluid,
   an enclosed thermal energy receiving channel in fluid communication with said small bellows, said thermal energy receiving channel adapted to receive said intermittent externally applied thermal energy to heat and expand said fluid in said thermal energy receiving channel,
   a large bellows in fluid communication with said thermal energy receiving channel to receive and store said fluid heated and expanded in said thermal energy receiving channel, said large bellows having a diaphragm, said diaphragm coupled to said small bellows compressing said small bellows upon expansion of said large bellows thereby forcing said fluid towards said thermal energy receiving channel, said diaphragm responsive to dissipation of said intermittent externally applied thermal energy into said fluid such that as said intermittent externally applied thermal energy is dissipated and said heated and expanded fluid contracts, said diaphragm acts upon said large bellows compressing said large bellows upon expansion of said small bellows thereby drawing said fluid back from said thermal energy receiving channel into said small bellows, and a return spring coupled with said diaphragm, said return spring acting upon said diaphragm to ensure that as said intermittent externally applied thermal energy is dissipated and said heated and expanded fluid contracts, said diaphragm acts upon said large bellows compressing said large bellows upon expansion of said small bellows thereby drawing said fluid back from said thermal energy receiving channel into said small bellows.

19. The thermal energy device of claim 18 wherein said thermal energy device includes an enclosure surrounding said small bellows and said large bellows, said enclosure of said small bellows and said large bellows including an orifice to accommodate a sudden decompression of a pressurized region outside said thermal energy device, said orifice venting said enclosure of said small bellows and said large bellows to said outside pressurized region such that said fluid in said thermal energy receiving channel can accommodate said externally applied thermal energy without interruption during said sudden decompression.

* * * * *